United States Patent [19]
Bergman et al.

[11] Patent Number: 5,489,341
[45] Date of Patent: Feb. 6, 1996

[54] SEMICONDUCTOR PROCESSING WITH NON-JETTING FLUID STREAM DISCHARGE ARRAY

[75] Inventors: Eric J. Bergman, Kalispell; Thomas H. Oberlitner, Whitefish, both of Mont.

[73] Assignee: Semitool, Inc., Kalispell, Mont.

[21] Appl. No.: 111,131

[22] Filed: Aug. 23, 1993

[51] Int. Cl.⁶ .................................................. B08B 3/04
[52] U.S. Cl. ................................. 134/26; 134/2; 134/3; 134/27; 134/32; 134/33; 134/34; 134/36; 437/946; 216/90
[58] Field of Search ................................. 134/26, 27, 33, 134/34, 36, 10, 95.3, 2, 3, 32; 437/946; 156/640; 216/90

[56] References Cited

U.S. PATENT DOCUMENTS

| | | |
|---|---|---|
| 4,165,252 | 8/1979 | Gibbs ............................. 156/655 |
| 4,495,024 | 1/1985 | Bok ............................... 134/34 X |
| 4,519,846 | 5/1985 | Aigo .............................. 134/15 |
| 4,600,463 | 7/1986 | Aigo ............................. 156/345 |
| 4,681,776 | 7/1987 | Bok ............................... 427/85 |
| 4,936,940 | 6/1990 | Kawasumi et al. ............ 156/345 |
| 5,168,886 | 12/1992 | Thompson ..................... 134/153 |

FOREIGN PATENT DOCUMENTS

| | | |
|---|---|---|
| 0434434 | 6/1991 | European Pat. Off. . |
| 0481506 | 4/1992 | European Pat. Off. . |
| 62-276831 | 12/1987 | Japan . |
| 4-017334 | 4/1992 | Japan . |

Primary Examiner—David L. Lacey
Assistant Examiner—Sean Vincent
Attorney, Agent, or Firm—Wells, St. John, Roberts, Gregory & Matkin

[57] ABSTRACT

A semiconductor processor and methods using pillar shaped liquid emitters. The emitters have emission ports upon which liquid domes of processing chemicals are formed. The domes are applied to the surface of a wafer to wash discrete areas and thereby allow gases evolved from the reaction to easily escape about the domes and through gas passageways existing about the pillars. The wafer is rotated to provide even processing of the treated surface.

26 Claims, 6 Drawing Sheets

SEMICONDUCTOR PROCESSING WITH NON-JETTING FLUID STREAM DISCHARGE ARRAY

TECHNICAL FIELD

This invention relates to apparatus and methods for processing semiconductors using liquids which produce gaseous products.

BACKGROUND OF THE INVENTION

The production of semiconductor devices, such as wafers, substrates, resulting integrated circuits, flat panel displays, data discs and other devices, often involves a variety of chemical processing steps. In some processes a liquid reactant is used which produces gaseous products. The production of gaseous products at the interface between the liquid processing fluid and the semiconductor piece can significantly effect the action of the reactant liquid upon the treated surface of the semiconductor material.

One example of chemistry which produces gaseous products involves the etching of silicon wafers (Si) using nitric acid ($HNO_3$) and hydrogen fluoride (HF). The reactions between these acids and silicon produce nitrous oxides of various stoichiometric ratios, most typically considered nitrogen dioxide ($NO_2$). The production of gases at the surface of the semiconductor piece causes the rate of reaction to be governed by diffusion through the gas-containing boundary layer. This diffusion limited rate characteristic of these and other reactions causes the processes to be more susceptible to rate variation across the wafer or other semiconductor piece. It also causes the reproducibility of the processes to vary to a greater degree than more typical liquid processes which are limited by chemical reaction rate mechanisms associated with the reactants rather than diffusion characteristics as in the reactions noted above.

Spray liquid and liquid immersion processes have previously been used to perform the gas-producing reactions explained above. These processes have suffered from the disadvantage that they expose both sides of a wafer to the chemical reaction and have variations in rate and reproducibility. Approaches to limit or protect exposure of the back side of the wafer have not been satisfactory because they do not fully protect the wafer or require significant additional processing time or additional processing materials.

Accordingly, there has remained a strong need for improved processing apparatus and improved processes for performing gas producing semiconductor processing.

BRIEF DESCRIPTION OF THE DRAWINGS

One or more preferred forms of the invention are described herein with reference to the accompanying drawings. The drawings are briefly described below.

FIG. 1 is a longitudinal sectional view showing the processing bowl and portions of a processing head forming parts of a preferred embodiment of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The Figures show pertinent portions of a preferred semiconductor processor 10 according to this invention. Processor 10 includes a deck 12 which forms a part of the frame. Deck 12 mounts a bowl assembly 13. A processing head 16 is movably mounted relative to the frame and bowl assembly using a suitable robotic arm (not shown). Processing head 16 is movable between loading positions wherein the head is removed from the bowl assembly and a processing position shown in FIG. 1. In the loading positions the processing head can be loaded with a semiconductor piece, such as semiconductor wafer 9. In the processing position, head 16 is in mating relationship with the bowl assembly to provide a substantially enclosed processing chamber 8. Processing chamber 8 forms part of a larger contained volume defined between bowl chassis 14, inner bowl subassembly 40, and the processing head 16, when head 16 is in the processing position.

Bowl assembly 13 includes a bowl chassis 14. Bowl chassis 14 is mounted to the deck using fasteners 15 which extend through apertures formed through the deck and into threaded receptacles formed in upper portions of the bowl chassis. Bowl chassis 14 extends downward in a substantially cylindrical configuration to provide portions of a process containment vessel provided by the bowl assembly and processing head. Bowl chassis 14 includes lateral exhaust ports 23 which extend through the wall of the bowl chassis to an exhaust plenum 29 and allow removal of vapors and gases using a suitable exhaust line (not shown) and associated vacuum supply (not shown).

Bowl assembly 13 also includes a top bowl piece 17 which extends about the upper portions of the bowl and is fastened to the deck using mounting fasteners 18 which extend through an upper mounting flange 19. Flange 19 is advantageously provided with a seal 20 mounted in an associated seal groove 21. Seal 20 aides in providing a substantially sealed relationship between the bowl assembly 13 and processing head 16.

The top bowl piece also has a downward primary extension 22 which forms a cylindrical barrel. A secondary extension 24 extend downwardly from the primary extension to form a mounting piece and diffusion baffle to communicate the evacuating action from the exhaust ports 23 about the periphery of the bowl assembly.

Top bowl piece 17 also includes a splash diverter 26 which extends inwardly and downwardly from the primary extension 22. The downward extending lip 27 of the splash diverter forms an annular drip lip. The drip lip is in spaced relative position to upper portions of an inner bowl 41. This serves to help contain spray or splash of processing chemicals or rinse liquids flying within the processing chamber 8.

The bowl assembly further includes a bottom subassembly 30. The bowl bottom subassembly 30 preferably has a first or upper ring member 32 and a second or lower ring member 34. Both ring members 32 and 34 are mounted to the lower edge of the bowl chassis 14 using fasteners 35.

The bowl assembly also includes an inner bowl subassembly 40. Subassembly 40 includes inner bowl piece 41. Inner bowl piece 41 is connected to an upper or first partition 43. First partition 43 forms a processing chamber floor which collects draining processing liquid and channels it to a drain 44. The processing liquid is emitted from a plurality of upstanding liquid emitters 46. Processing liquid is supplied to the emitters 46 from an inter-partition supply chamber 47 which is sealed between first partition 43 and a second or lower partition 48. The upper and lower partitions are both connected to the inner bowl 41 by threading the inner bowl piece down over male threads formed on the outside of lower partition 48.

The first partition 43 and associated liquid emitters 46 form a liquid distributor 49 which applies processing liquids to the treated lower side of wafer 9. The Figures do not show all intended emitters 46, but only an exemplary sample. It is desired to have a full emitter array with emitters at various radial positions about the central axis X—X. Each liquid emitter 46 is preferably formed as a free-standing pillar or column extending toward the treated wafer surface from a suitable mounting location, such as from the processing chamber partition 43. As shown, this is preferably accomplished using individual emitter pieces which are received within emitter receptacles formed in the first partition 43. The pillar-shaped emitters 46 are preferably upstanding and provided with emission ports 61 (FIG. 3) from which liquid processing chemicals are emitted in non-jetting streams.

Figure 2:
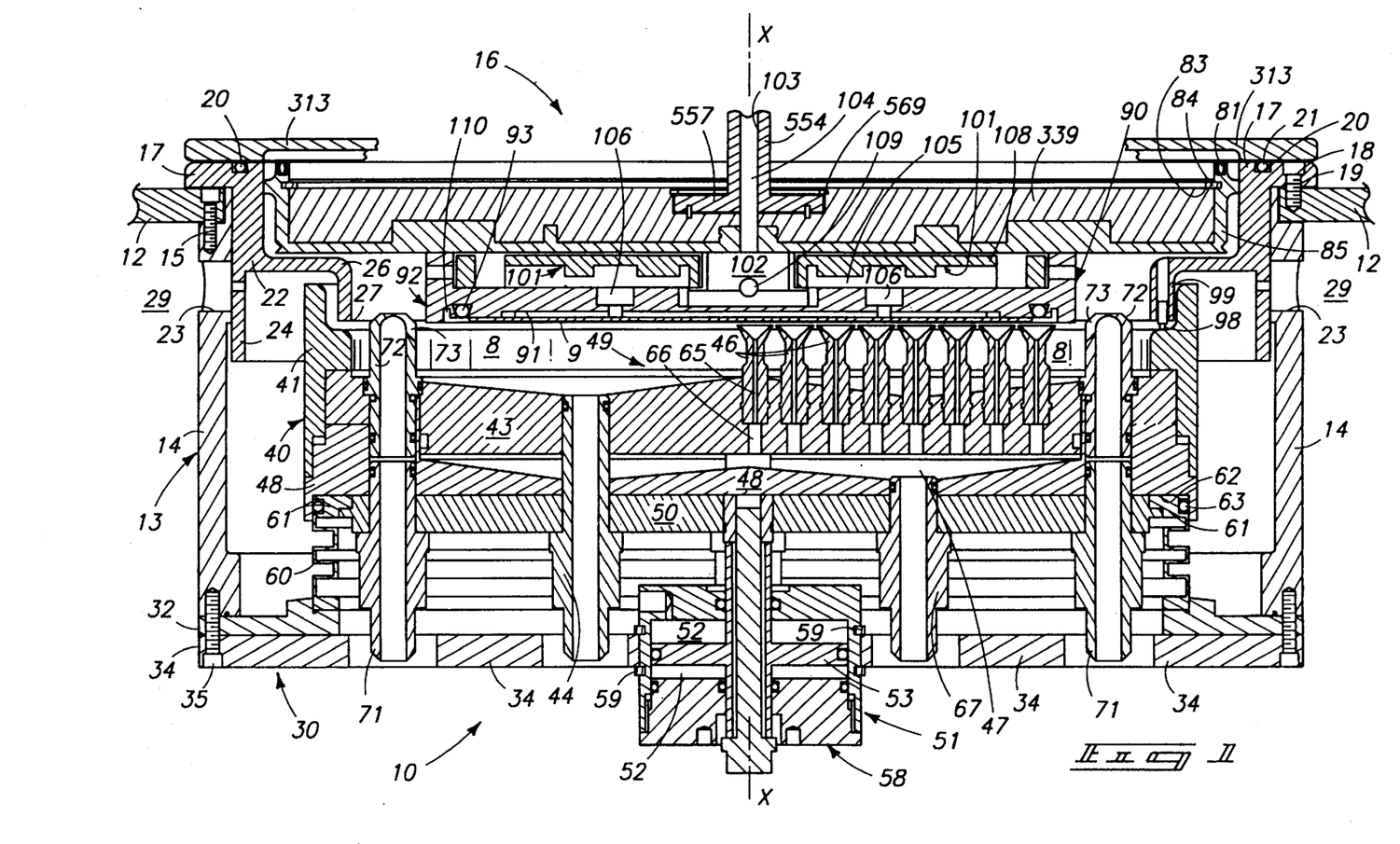
FIG. 2 is a top view of the bowl portion shown in FIG. 1.
Figure 3:
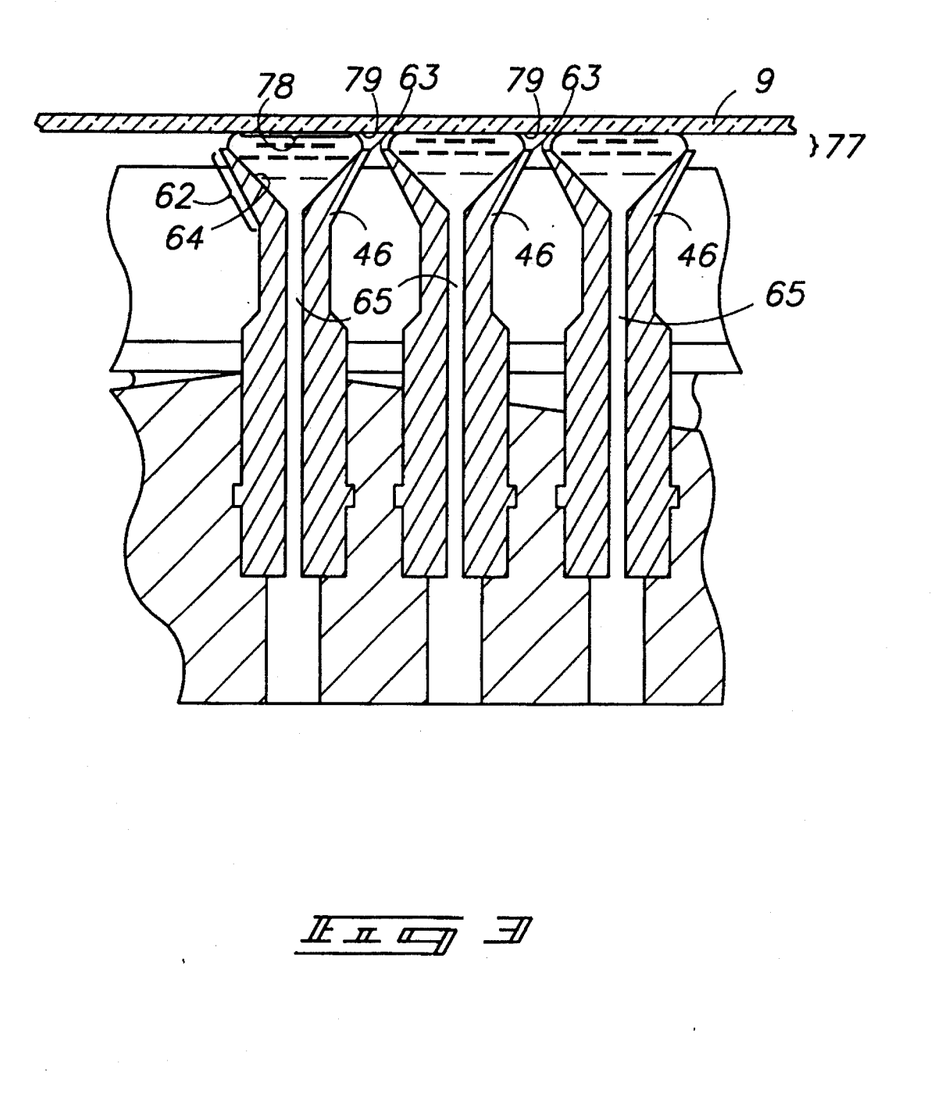
FIG. 3 is an enlarged view showing several liquid emitters in the process of applying processing liquid to a portion of the treated surface of a semiconductor wafer.

FIG. 3 shows that the emission ports are preferably defined by spout portions 62 of the emitters. The spouts are preferably flared outwardly toward the emission ports which are circumscribed by spout rims 63. The spouts have an internal cup-shaped chambers 64 adjacent to the emission ports. The flared configuration of the spouts and associated cup chambers act to slow the velocity of the flowing liquid chemicals and provide a larger emission port.

Emitter cup chambers 64 receive flows of liquid chemicals from emitter flow passageways 65 formed within the emitter pieces. The emitter flow passageways are in fluid communication with first partition supply passages 66 formed in the first partition 43. Passages 66 are in fluid communication with the inter-partition liquid supply chamber 47. Chamber 47 is supplied liquid via a liquid supply fitting 67 which extends through second partition 48.

Processing liquid is provided at a relatively slow flow rate so that a meniscus 76 (FIG. 3) is formed by surface tension extending from spout rims 63 upwardly toward the middle of the emission port in a liquid emission dome which is at least partially convex. The height of the meniscus dome is sufficient to be greater than the clearance gap 77 between the treated surface of the wafer and the emitter spout rims. This causes an emitter wash or washed area 78 to be wetted upon the treated surface for each emitter 46 when the clearance gap is within a suitable range. Preferred clearance gaps are in the range 0.010–0.100 inches (~0.3–2.5 millimeters), more preferably 0.020–0.070 inches (~0.5–1.8 millimeters). The spacing of the emitters 46 is preferably close but of sufficient spacing so the adjacent emitter washes on the treated surfaces are spaced to provide inter-wash gas escape channels 79.

The inner bowl assembly 40 is preferably constructed and mounted to allow extension and retraction relative to the wafer 9. As shown, this is accomplished using an inner bowl support plate 50 which connects with the lower partition 48.

An extension actuator or operator 51 is controlled to move the inner bowl assembly into adjustable extended and retracted positions. As shown the actuator 51 moves the inner bowl assembly vertically upward or downward within a structurally limited range and as desired and controlled.

The extension operator 51 is supported upon the lower bottom wall piece 34 using opposing retainer rings 59 (not shown). The operator includes an operator housing 58 which encloses an internal chamber 52. Inside of the internal chamber is a slidably movable piston assembly 53. Pneumatic pressure is applied to the appropriate side of the piston to force the piston assembly upwardly or downwardly relative to the housing. This forces the support plate 50 and lower partition 48 upwardly and downwardly to position the inner bowl assembly 40 and attached liquid distributor 49. This enables the clearance gap 77 to be adjustable. It also allows the wafer to be positioned into the processing chamber when the processing head is moved into mating relationship with the bowl assembly, and thereafter the clearance gap can be reduced in preparation for the actual treatment process.

The inner bowl assembly movement is preferably limited by an adjustable stop system. As shown the preferred stop system uses three adjustable threaded stop pieces 98 which are threaded into bores. The bores are advantageously formed at enlarged bosses 99 in top bowl piece 17.

The inner bowl assembly is preferably also provided with a flexible bellows member 60. Bellows 60 provides flexible sealing against vapors and liquids which enter the outer portions of the containment chamber, outside of process chamber 8. The bellows allow specific axial positioning of the inner bowl assembly and liquid distributor as just explained by the extension operator 51. The top portion of bellows 60 includes a top bellows flange 61. The top bellows flange is positioned within a mounting receptacle 62 formed in the lower portion of the second partition 48. A peripheral seal 63 is held within a groove formed about the outer surface of the top bellows flange. A bellows top piece is formed by support plate 50 which extends across the top of the bellows and is fastened to the second partition 48 using suitable fasteners (not shown).

Liquid supply fitting 67 is mounted in the bellows top piece through a mounting aperture formed therein. A liquid drain or outflow fitting 44 is also mounted in the bellows top piece and extends through both partitions 43 and 48 to remove liquid which has drained from the liquid emitters 46. The bellows top piece also supports fittings 71 which are in fluid communication with spray pipes 72. Spray pipes 72 are positioned laterally from the wafer and include jet openings 73 which direct a spray of rinse water or other rinse liquid across the lower treated surface of wafer 9. There are preferably two spray pipes 72.

Figure 4:
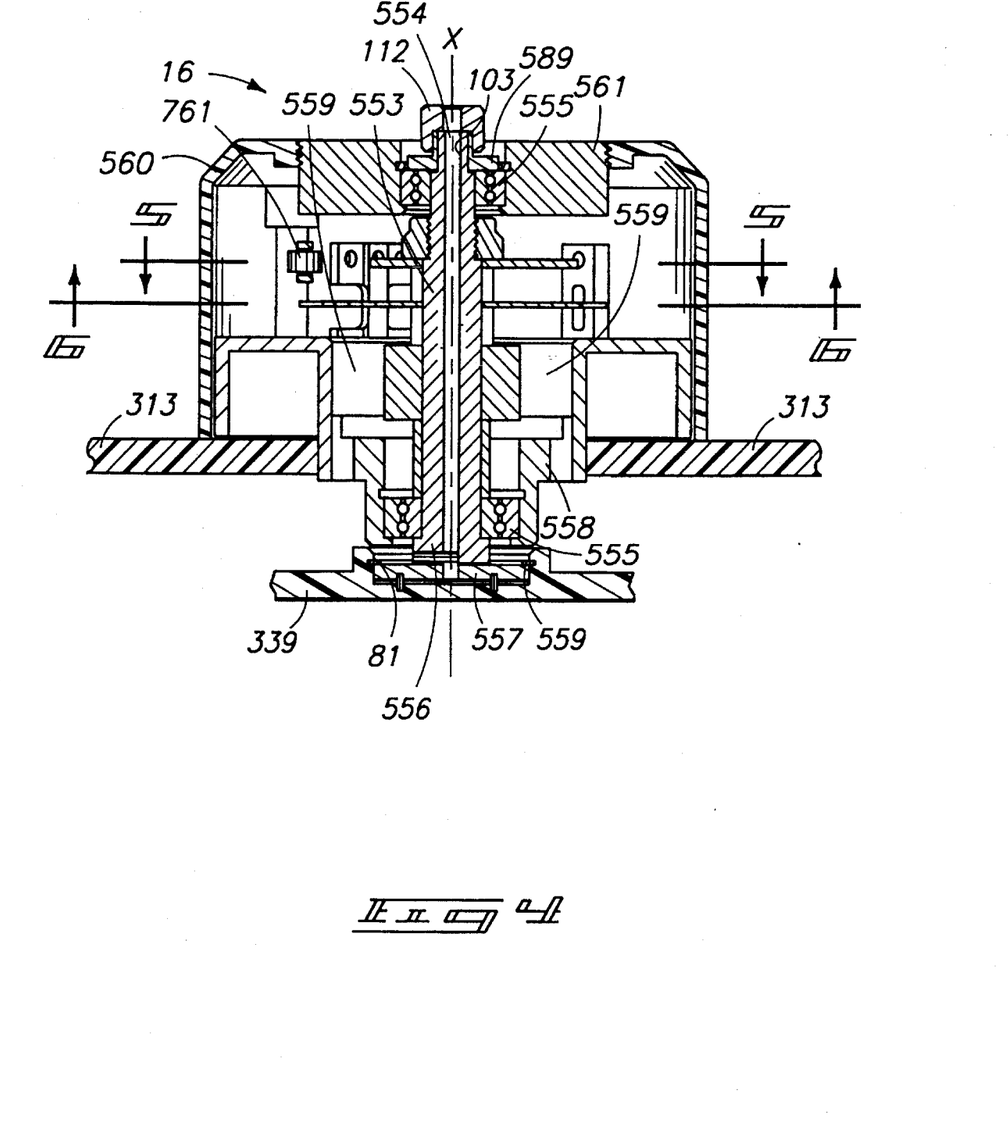
FIG. 4 is a longitudinal sectional view showing additional portions of the processing head shown in FIG. 1.
Figure 5:
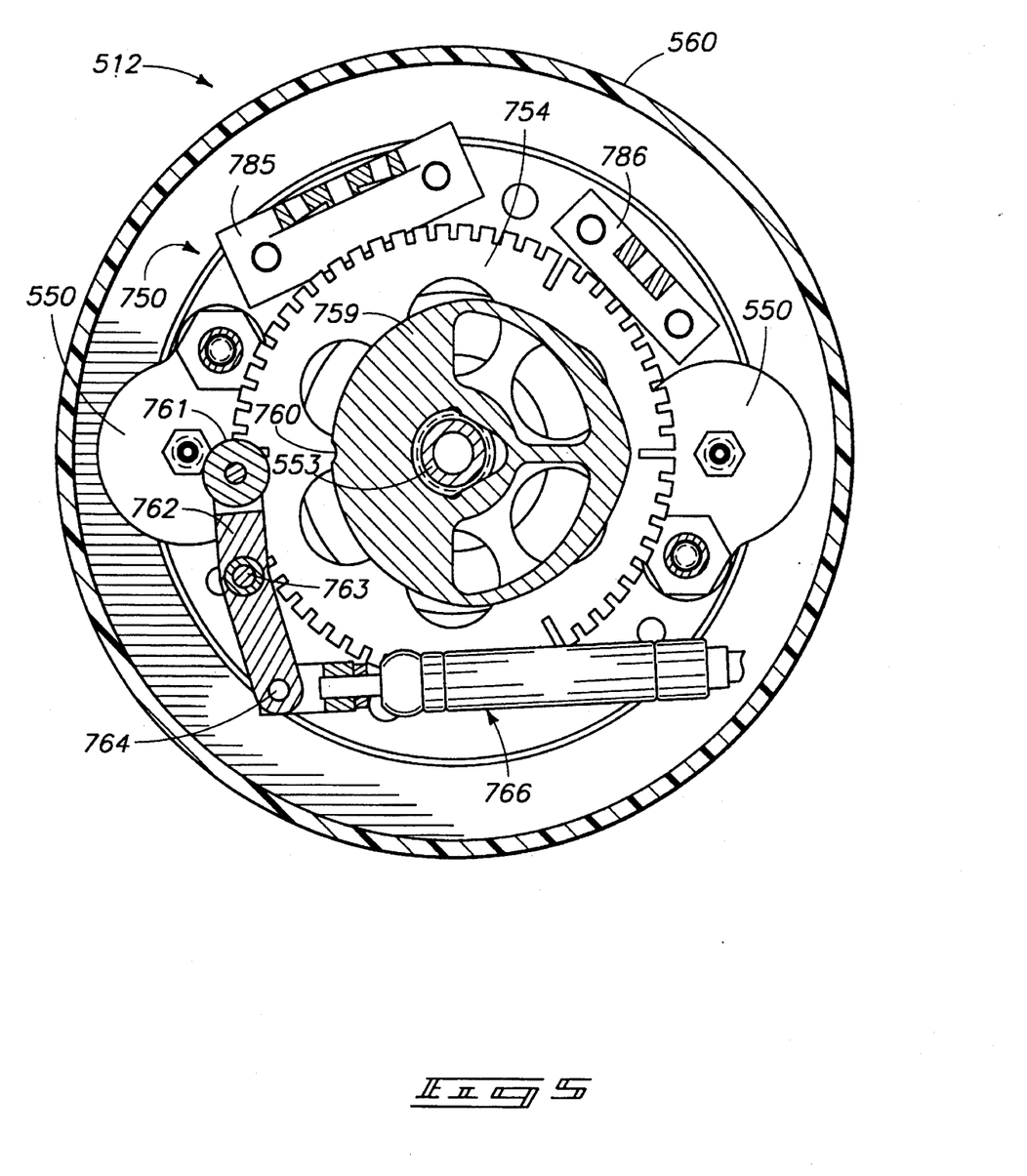
FIG. 5 is a cross-sectional view taken along line 5—5 of FIG. 4.
Figure 6:
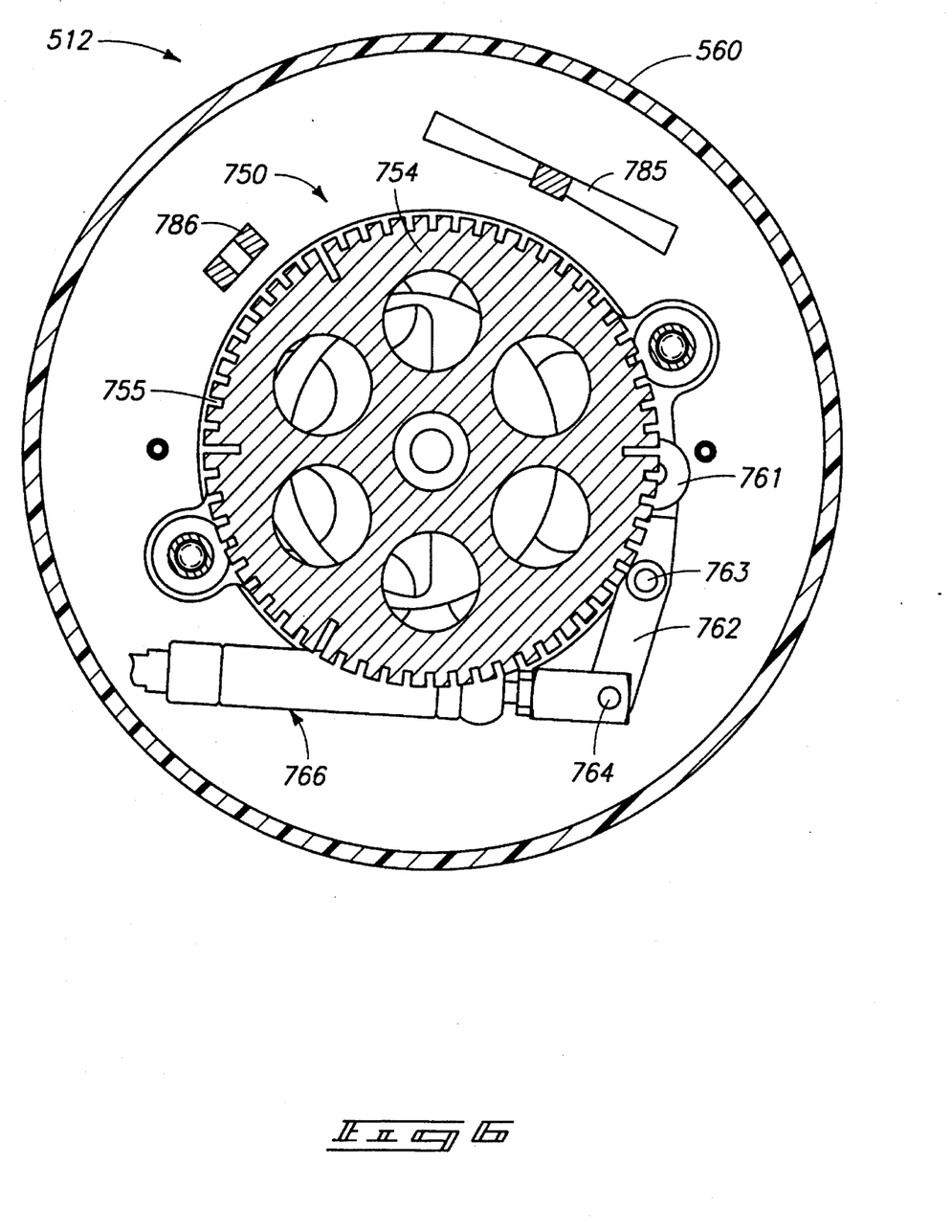
FIG. 6 is a cross-sectional view taken along line 6—6 of FIG. 4.

The construction of the preferred processing head 16 will now be described in greater detail. FIG. 1 shows portions of processing head 16. Additional portions and details of the processing head are shown in FIGS. 4–6. As shown, processing head 16 includes a shroud 313 which is the main structural part of the head. Shroud 313 is mounted to a robotic arm (not shown) which is used to move the head into the mating position shown in FIG. 1, and removed loading positions (not shown) wherein wafer 9 can be loaded onto the processing head using a wafer handling device of conventional construction (not shown).

A rotating assembly forming a part of the processing head is mounted for rotation relative to the shroud. The rotating assembly includes a rotor having an inner rotor piece 339.

The inner rotor piece is constructed to fit within a receptacle 81 formed within the upper face of an outer rotor piece 85. The outer rotor piece is provided with a groove 84 which mounts a snap ring or other suitable removable retainer ring 83. Retainer ring 83 secures the inner and outer rotor pieces together.

The rotor is provided with a suitable wafer support or other means for holding the wafer 9 or other semiconductor piece in position. The wafer is held upon the rotor against the force of gravity. It is also held for rotation by the rotor during processing. As shown, processing head 16 is provided with a vacuum chuck wafer holder 90 which supports the wafer. Vacuum chuck 90 has a vacuum recess 91 formed in the lower face of the wafer support piece 92. The wafer support piece 92 is secured to the outer rotor piece 85 using fasteners (not shown). The wafer support face of piece 92 is also advantageously provided with an edge seal 93 which is held with an associated edge seal groove. The outer peripheral edge of the wafer contacts the wafer support piece 92 at the edge seal 93. This sealing contact along the wafer periphery serves to enhance vacuum retention of the wafer and further helps prevent processing liquids and gases existing within the processing chamber from migrating across the back or upper surface of wafer 9. This reduces or eliminates the need for any back surface protection for the wafer, such as coatings or temporary overlays.

The vacuum chuck wafer holder also preferably includes a pair of aspirators 101. Both aspirators are rectangular bars extending radially outward from the centerline or rotational axis of the rotating assembly. Aspirators 101 can be selected from commercially available products of varying specific construction. Aspirators 101 are supplied with a suitable pressurized gas, such as compressed nitrogen or clean dry air via an aspirator supply plenum 102. Plenum 102 is supplied with gas via a rotor shaft internal passageway 103 and rotor piece gas supply passageways 104.

As shown aspirators 101 have a body 108 which are provide with gas passageways 105. The gas passageways are substantially enclosed except near the ends. Gas passes from the plenum 102 and produces a vacuum pressure in vacuum counterbores 106 according to the well-known Venturi effect. The vacuum pressure communicated via bores 106 is applied to the vacuum recess 91 and back surface of wafer 9 to retain the wafer in position upon the wafer holder.

Pressurized gas within plenum 102 is also communicated via an edge supply gallery 109 to an annular edge blanket gas supply groove 110, via additional passageways (not shown in the sectional view of FIG. 1). This construction allows the wafer support head to provide both a vacuum for retaining the wafer and pressurized gas for blanketing or purging the edge of the wafer with a protective gas purge, using a single pressurized gas supply via passageway 103 and associated gas supply fitting 112 (FIG. 4).

FIG. 4 shows that the processor head assembly 16 also includes a cap 560 which covers a drive assembly that is described more fully below. The wafer support rotor drive assembly includes a motor 559 which is mounted upon motor support 558. Motor 559 is preferably a brushless DC motor. Motor 559 has a hollow outer motor shaft 553 supported by two sets of ball bearings 555. The hollow motor shaft 553 has a flanged shaft head 556 at its lower end. The hollow motor shaft 553 receives an inner motor shaft 554 therein. The inner motor shaft has a disk-shaped head 557 which is suitably connected to the wafer support plate 539, such as by being received and connected within the wafer support plate motor mounting receptacle 568. The disk-shaped head 557 is firmly held in this receptacle using a ring retainer 569. The upper end of the inner shaft 554 is held in position by retaining nut 589.

The angular positions of the rotating assembly about rotational axis X—X are preferably controlled to assume a particular desired position when the rotatable wafer support 530 stops. This indexing of the stationary position of the rotor is desired for assurance of wafer positioning when loading and unloading the processing head to provide proper and unique positional engagement of the wafer by a wafer handling paddle or other wafer handler (not shown).

FIGS. 5 and 6 show an indexing means 750 used to position the wafer support, motor and other rotatable parts forming the rotating assembly of the processing head drive. Rotor positioning or indexing mechanism 750 includes a cammed rotor plate 759 mounted to rotate with motor shaft 553. The cam plate 759 has a single low point or perigee which is precisely defined by detent 760. Detent 760 allows the rotor and wafer support member to be positioned in a single desired rotational position when stopped. The outer periphery of the cam plate is sloped radially from a high point or apogee which is opposite detent 760 toward the perigee at the detent.

A roller 761 is mounted at one end of a crank arm 762. Crank arm 762 is pivotally supported on a supporting shaft 763. The opposite end of crank arm 762 includes a pivotal connection 764 at which is joined the outer end of a pneumatic ram assembly 766.

The pneumatic ram 766 is normally spring biased into a retracted position wherein roller 761 is radially clear of the cammed rotor plate 759. To index the rotating assembly the roller is extended inwardly to engage the cammed rotor plate. Roller 761 is extended by pneumatic ram 766 which pivots arm 762 upon which the roller is mounted. The roller 761 is extended inward when the rotating assembly and cam plate 759 are nearly stopped. The roller bears against the edge of rotor plate 759 to stop the rotor when roller 761 is received in detent 760. The detent assures that the fingers 534 are uniquely indexed to thereby facilitate interaction with related wafer transfer equipment (not shown).

A rotor position and motion monitoring subsystem is also advantageously provided within processing head 512 for measuring the speed and direction of rotation of the wafer plate 530 about the rotational axis X—X. This subsystem also allows confirmation of the position of the rotor after ram 766 is extended. The rotor position and motion monitoring subsystem includes a rotor indicating element such as rotor indicator disk 754, best shown in FIG. 6. Indicator disk 754 is provided with a series of peripheral notches 755 which intermittently pass and interrupt three optical beams. The three optical beams are provided by paired emitters and detectors (not shown) which beam through the notches on disk 754. Two optical emitter detector pairs are mounted upon bracket 785. These two are aligned to intermittently pass two beams through notches 755. The two emitter detector pairs are spaced so that they are out of phase from one another by an amount which produces a different phase shift depending upon whether the direction is clockwise or counter-clockwise. The third emitter detector pair is mounted upon mounting bracket 786 and is aligned to intermittently pass through the deeper notches and confirm proper positioning after ram 766 has been extended.

The invention is used in a variety of processing applications in the manners described hereinabove. The various components are made using a variety of metal and plastic forming techniques, such as machining or molding into the parts shown and described herein.

The invention further includes novel processes or methods for treating semiconductor pieces. Exemplary methods include the etching of silicon or the chemical removal of silicon from silicon wafers to thin the wafers to a desired thickness without inducing residual mechanical stresses into the wafer such as is a result of mechanical thinning operations. The methods of this invention can also be used to provide additional chemical removal of semiconductor surfaces, such as silicon surfaces which have been stressed due to partial mechanical removal of silicon. Additionally the processes can be used in a number of other applications which similarly involve chemical treatment of semiconductor pieces which evolve significant amount of gaseous products.

The novel processes include positioning a treated surface of a semiconductor piece, for example wafer 9, into face-to-face relationship with a liquid distributor located within a processing chamber. This is exemplified by liquid distributor 49 and processing chamber 8. A clearance gap 77 exists between the treated surface and the emission ports at the distal ends of the liquid emitters 46. Thereafter the clearance gap is adjusted as desired by controlling and adjusting the position of the liquid distributor operator 51 and attached liquid distributor.

Once the relative position of the semiconductor wafer and liquid distributor have been achieved, it is then possible to begin treatment by emitting the desired processing liquids in non-jetting emission streams. The streams are preferably spill streams which emerge from the emission ports 61 and slowly spill or overflow the spout rims 63 to drain upon the upper partition 43 and down to the drain fitting 44. The spouts are preferably configured to provide level rims which face upwardly. Examples of suitable processing liquids include an aqueous mixture of HF and $HNO_3$. The emitting step is done by pumping a controlled amount of liquid to supply fitting 67 using a conventional pump (not shown). The flowing liquid causes charging of chamber 47 and flowing of the liquid up through the liquid passageways 65 within emitters 46. The liquid emissions or discharges include forming meniscuses or liquid domes across the emission ports 61 upon the spouts of the emitters. The formation of these meniscuses is coordinated so that the height of the dome is greater than the clearance gap 77 so that the emitted streams cause an emitter washes or washed areas 78 to be applied to the treated surface of the semiconductor piece 9. Thus the processes include washing the treated surface with a plurality of non-jetting, discrete emitter streams or meniscuses to produce discrete emitter washes upon the treated surface.

The emitting and washing steps are preferably accompanied by rotating the wafer 9 using the rotor and associated rotor drive. This is preferably accomplished at relatively slow rotational speeds in the range of 1–60 rpm, more preferably 5–20 rpm.

The evolution of gases from the reactions occurring at the treated surface are handled by passing produced gases from the washed areas through gas escape passages formed between the liquid emitters, such as about the pillar shaped emitters. The produced gases are then handled by exhausting the gases from the escape passages and from the processing chamber, such as through the exhaust ports 23 and exhaust plenum 29.

The novel methods can further comprise arresting the chemical or other treatment of the semiconductor piece by axially removing the treated surface from the emission streams. This can advantageously be done by lowering the liquid distributor so that the meniscuses no longer wash the treated surface. This is advantageous in stopping the chemical reactions with good precision, to thereby enhance processing reproducibility.

The methods can further include spray rinsing the treated surface such as by spraying a rinsing liquid, such as water, from the spray heads 72 to remove residual processing chemicals.

The wafer can also be dried by passing drying gas through the processing chamber and out via the exhaust ports. Drying gas can be supplied through the spray pipes 72 or via other means (not shown).

In compliance with the statute, the invention has been described in language necessarily limited in its ability to properly convey the conceptual nature of the invention. Because of this inherent limitation of language, it must be understood that the invention is not necessarily limited to the specific features described, since the means herein disclosed comprise merely preferred forms of putting the invention into effect. The invention is, therefore, claimed in any of its forms or modifications within the proper scope of the appended claims appropriately interpreted in accordance with the doctrine of equivalents.

We claim:

1. A method for processing a treated surface of a semiconductor piece using a liquid, comprising:

holding the semiconductor piece in a support to allow controlled positioning of the semiconductor piece relative to a liquid distributor;

positioning said treated surface of the semiconductor piece into face-to-face relationship with the liquid distributor; said liquid distributor being located within a processing chamber and having an emitter array formed by a plurality of spaced liquid emitters; said positioning defining a clearance gap between emission ports of the liquid emitters and the treated surface of the semiconductor piece;

providing gas escape passages formed between said liquid emitters of said emitter array;

emitting a plurality of non-jetting emission streams of the liquid from the liquid emitters;

said clearance gap being sufficiently close such that said emitting produces a plurality of localized wash areas upon the treated surface with the non-jetting emission streams as the emission streams flow from the emission ports of the liquid emitters;

controllably moving the semiconductor piece relative to the liquid emitters;

allowing gases to pass through the gas escape passages.

2. A method according to claim 1 and further comprising exhausting gas from the processing chamber.

3. A method according to claim 1 and further comprising rotating the semiconductor piece relative to the liquid emitters.

4. A method according to claim 1 wherein said liquid emitters are upstanding with spouts at upper ends thereof.

5. A method according to claim 1 wherein said liquid emitters have spouts at distal ends thereof; said spouts having rims which are approximately level.

6. A method according to claim 1 wherein said liquid emitters are upstanding with spouts at upper ends thereof; said spouts having rims which are approximately level.

7. A method according to claim 1 wherein said liquid emitters are upstanding and said emitting step is accomplished by overflowing liquid from said liquid emitters in spill streams.

8. A method according to claim 1 and further comprising draining liquid emitted by the liquid emitters from the processing chamber.

9. A method according to claim 1 and further comprising adjusting the clearance gap by changing the relative positioning of the support relative to the emitter array.

10. A method according to claim 1 and further comprising adjusting the clearance gap by changing the position of the emitter array.

11. A method according to claim 1 and further comprising adjusting the clearance gap by changing the position of the emitter array using a pneumatic operator.

12. A method according to claim 1 and further comprising spraying the treated surface with a rinse liquid.

13. A method according to claim 1 and further comprising spraying the treated surface with a rinse liquid from laterally positioned spray heads.

14. A method for processing a treated surface of a semiconductor piece using a liquid, comprising:

holding said semiconductor piece with a piece holder;

positioning said treated surface of the semiconductor piece into face-to-face relationship with a liquid distributor located within a processing chamber; said liquid distributor having an emitter array formed by a plurality of spaced liquid emitters; said positioning defining a clearance gap between emission ports of the liquid emitters and the treated surface of the semiconductor piece;

providing gas escape passages formed between said liquid emitters of said emitter array;

emitting a plurality of non-jetting emission streams of the liquid from the liquid emitters; .

said clearance gap being sufficiently close to allow washing localized wash areas of the treated surface with the non-jetting emission streams as the emission streams flow from the emission ports of the liquid emitters;

adjusting the clearance gap by changing the relative positioning of said piece holder relative to the emitter array;

allowing gases to pass through the gas escape passages.

15. A method according to claim 14 wherein said adjusting the clearance gap is accomplished by changing the position of the emitter array.

16. A method according to claim 14 wherein said adjusting the clearance gap is accomplished by changing the position of the emitter array using a pneumatic operator.

17. A method according to claim 14 and further comprising moving the semiconductor piece relative to the liquid emitters.

18. A method according to claim 14 and further comprising exhausting gas from the processing chamber.

19. A method according to claim 14 and further comprising rotating the semiconductor piece relative to the liquid emitters.

20. A method according to claim 14 wherein said liquid emitters are upstanding with spouts at upper ends thereof.

21. A method according to claim 14 wherein said liquid emitters have spouts at distal ends thereof; said spouts having rims which are approximately level.

22. A method according to claim 14 wherein said liquid emitters are upstanding with spouts at upper ends thereof; said spouts having rims which are approximately level.

23. A method according to claim 14 wherein said liquid emitters are upstanding and said emitting step is accomplished by overflowing liquid from said liquid emitters in spill streams.

24. A method according to claim 14 and further comprising draining liquid emitted by the liquid emitters from the processing chamber.

25. A method according to claim 14 and further comprising spraying the treated surface with a rinse liquid.

26. A method according to claim 14 and further comprising spraying the treated surface with a rinse liquid from laterally positioned spray heads.

* * * * *